United States Patent
Kim

(10) Patent No.: US 7,361,575 B2
(45) Date of Patent: Apr. 22, 2008

(54) SEMICONDUCTOR DEVICE AND METHOD FOR MANUFACTURING THE SAME

(75) Inventor: Tae Woo Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 34 days.

(21) Appl. No.: 11/614,748

(22) Filed: Dec. 21, 2006

(65) Prior Publication Data
US 2007/0145537 A1    Jun. 28, 2007

(30) Foreign Application Priority Data
Dec. 26, 2005    (KR)    ............. 10-2005-0129864

(51) Int. Cl.
*H01L 21/00*    (2006.01)
(52) U.S. Cl. ............... 438/465; 438/462; 257/E21.599
(58) Field of Classification Search ................ 438/462, 438/465, 637
See application file for complete search history.

(56) References Cited

U.S. PATENT DOCUMENTS

| | | | |
|---|---|---|---|
| 5,981,352 A * | 11/1999 | Zhao et al. ................. | 438/401 |
| 6,060,787 A * | 5/2000 | Zhao et al. ................. | 257/797 |
| 6,251,788 B1 * | 6/2001 | Liou ........................... | 438/693 |
| 6,696,353 B2 * | 2/2004 | Minn et al. ................. | 438/462 |
| 6,709,973 B1 * | 3/2004 | Sakamoto ................... | 438/633 |
| 6,841,451 B2 * | 1/2005 | Okayama et al. ........... | 438/401 |
| 6,841,455 B2 * | 1/2005 | West et al. ................. | 438/462 |
| 2002/0151137 A1 * | 10/2002 | Kwon ........................ | 438/260 |

FOREIGN PATENT DOCUMENTS

| KR | P1999-025046 | 4/1999 |
|---|---|---|
| KR | P1999-0081299 | 11/1999 |

* cited by examiner

*Primary Examiner*—David A. Zarneke
(74) *Attorney, Agent, or Firm*—Sherr & Nourse, PLLC

(57) ABSTRACT

Embodiments relate to a semiconductor device and a method for manufacturing a semiconductor device that may be capable of improving a step coverage of main chip and scribe lane regions during a formation of an interlayer dielectric are provided. In embodiments, the semiconductor device may include metal layers formed on a substrate including a main chip region and a scribe lane region, respectively, an interlayer dielectric formed on the substrate including the metal layers, a step coverage improving layer formed on an interlayer dielectric of the scribe lane region, a via hole inside the step coverage improving layer and the interlayer dielectric, and a via plug formed by filling the via hole with a metal.

9 Claims, 4 Drawing Sheets

SEMICONDUCTOR DEVICE AND METHOD FOR MANUFACTURING THE SAME

The present application claims priority under 35 U.S.C. 119 and 35 U.S.C. 365 to Korean Patent Application No. 10-2005-0129864 (filed on Dec. 26, 2005), which is hereby incorporated by reference in its entirety.

BACKGROUND

As semiconductor devices have become more highly integrated, a number of metal wirings may be increased. In addition, a pitch of the metal wirings may be reduced. Due to a pitch reduction of the metal wirings, a resistance of the metal wirings may be increased. An interlayer dielectric may insulate the metal wirings from each other. Metal wirings may produce parasitic capacitance, which may have a detrimental effect on a semiconductor device. That is, an RC constant that may determine a response speed of a semiconductor device and power consumption may be increased.

There may be a need for an interlayer dielectric having a low dielectric constant that may be suitable for highly integrated semiconductor devices. In some instances, instead of using an un-doped silica glass (USG), a fluorine silicate glass (FSG) may be used as the interlayer dielectric having a low dielectric constant.

Although fluorine system film may have excellent gap-fill characteristics, a difference of film thickness between highly integrated patterns and non-highly integrated pattern has increased.

FIGS. 1 and 2 are example diagrams illustrating a related art method for forming an interlayer dielectric of a semiconductor.

Scribe lane region 1, which may be a photo key region for an interlayer mutual connection, and a main chip 2 are illustrated in FIG. 1.

Referring to FIG. 1, an oxide may be deposited on first metal M1, for example by chemical vapor deposition (CVD) First interlayer dielectric 20 may thus be formed. Chemical mechanical polishing (CMP), for example via photolithography, and via etch processes may be sequentially performed, and may form a via hole.

The via hole may be filled, for example with a tungsten W 10, and may form a via electrode. Second metal M2 may be patterned, for example on the via hole.

Shallowing of metal lines in a sidewall may occur if a step coverage characteristic deteriorates during a metal physical vapor deposition PVD, and may cause a high resistance and electromigration in a surface planarized by the CMP.

During a photolithography process for forming the via hole, due to an oxide step coverage of a first interlayer dielectric in a photo key and overlay pattern present at a main chip region 2 and a scribe lane region 1, a defocus may occur during the via photolithography process. Accordingly, as illustrated in main chip region 2 of FIG. 1, an opening of a via hole, may not be completed.

Referring to FIG. 2, an oxide may be deposited on second metal M2, for example by a CVD, and may form second interlayer dielectric 21. A planarization process may be carried out by the CMP. A via hole may then be formed by via photolithography/etch processes.

The via hole may be filled with tungsten 11, and a third metal M3 may be formed. As the interlayer dielectric is increased, a via photolithography defocus may become significant due to an increase in a step coverage difference in the photo key and overlay pattern present at the scribe lane region 1 and the main chip region 2.

FIG. 3 is a SEM photograph showing a via that is not open due to a step coverage. As described above, in the CMP process being performing after a formation of the interlayer dielectric, as the step coverage characteristic deteriorates, a defocus may arise during a formation of the via hole. This may reduce a yield of semiconductor devices.

SUMMARY

Embodiments relate to a semiconductor device and a method for manufacturing the same.

Embodiments relate to a method for manufacturing a semiconductor device that may be capable of improving a step coverage of main chip and scribe lane regions during formation of an interlayer dielectric.

Embodiments relate to a method for manufacturing a semiconductor device, which may reduce a defocus phenomenon in a via hole formation process, which process may be a subsequent process to forming a step coverage after the formation of the interlayer dielectric, and may thereby improve a yield of the semiconductor device.

In embodiments, a semiconductor device may include metal layers formed on a substrate including a main chip region and a scribe lane region, respectively, an interlayer dielectric formed on the substrate including the metal layers, a step coverage improving layer formed on an interlayer dielectric of the scribe lane region, a via hole inside the step coverage improving layer and the interlayer dielectric, and a via plug formed by filling the via hole with a metal.

In embodiments, a method for manufacturing a semiconductor device may include forming metal layers on a substrate including a main chip region and a scribe lane region, respectively, forming an interlayer dielectric on the substrate including the metal layers, planarizing the interlayer dielectric, forming a step coverage improving layer on the interlayer dielectric of a planarized scribe lane region, planarizing the step coverage improving layer, forming a via hole in the planarized step coverage improving layer and the planarized interlayer dielectric, and forming the via hole with a metal to form a via plug.

DETAILED DESCRIPTION OF EMBODIMENTS

Figure 1:
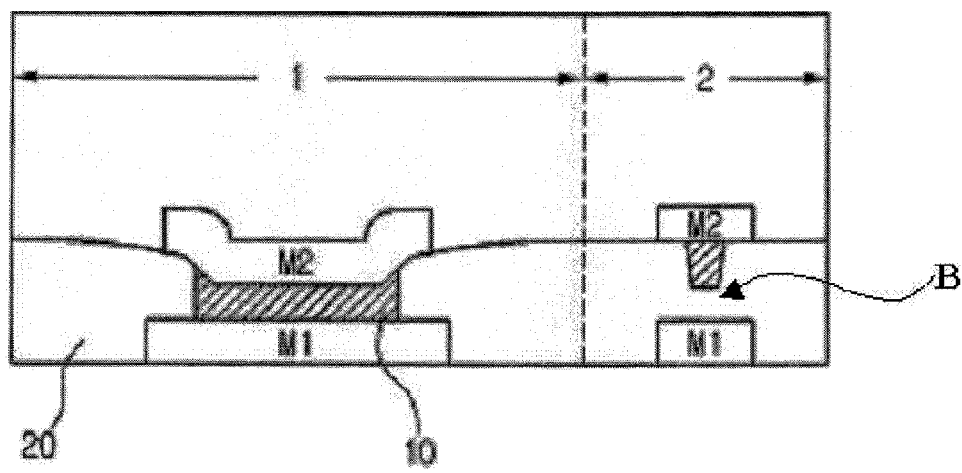
FIGS. 1 and 2 are example diagrams illustrating a related art method for forming an interlayer dielectric of a semiconductor.
Figure 2:
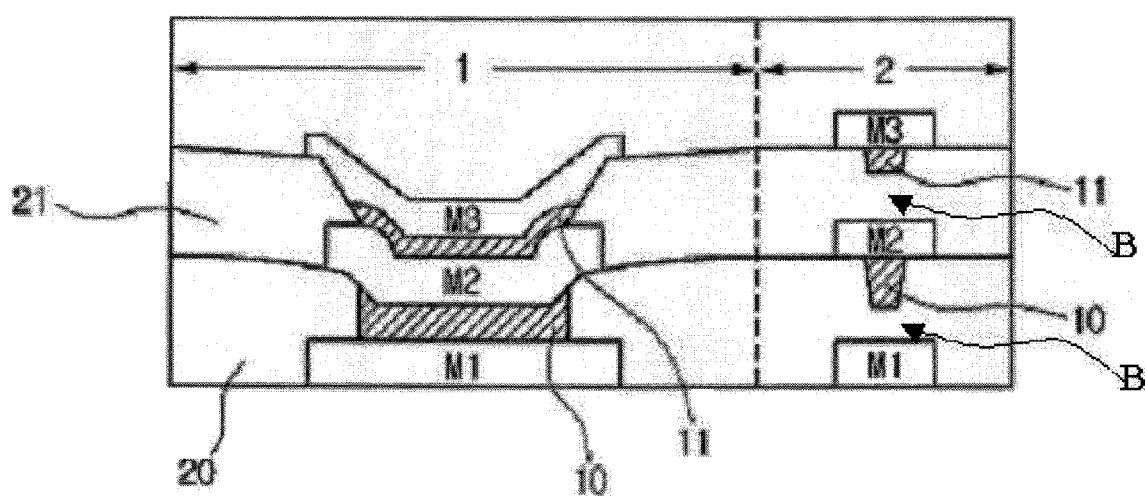
Figure 3:
FIG. 3 is a SEM photograph showing a via that is not open due to a step coverage.
Figure 4:
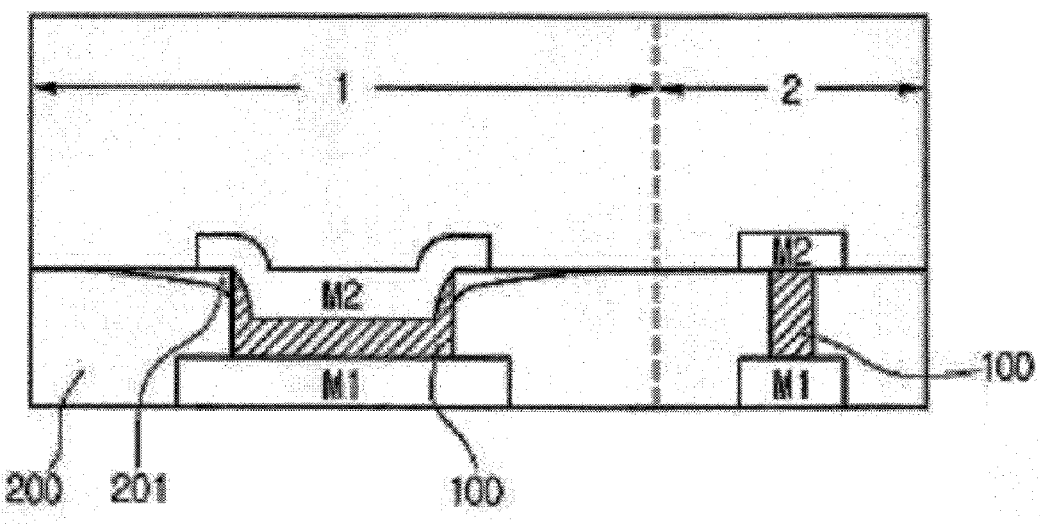
FIGS. 4 and 5 are example cross-sectional diagrams of a semiconductor device, illustrating a method for manufacturing a semiconductor device according to embodiments.

Scribe lane region 1, which may be a photo key region for an interlayer mutual connection, and a main chip 2 are illustrated in FIG. 4.

Referring to FIG. 4, an oxide may be deposited on first metal M1 of a lower portion in a semiconductor device, for example by a CVD, and may form a first interlayer dielectric 200. Further, a CMP may be carried out on a surface of first interlayer dielectric 200, and may planarize it.

First step coverage improving layer 201 may be deposited on first interlayer dielectric 200. A planarization etch back process may be performed for the resulting object, and may enhance a step coverage of main chip 2 and scribe lane 1 regions. According to embodiments, the planarization etch back process may remove 80±10% range of a thickness of first step coverage improving layer 201, which may be further deposited.

Thus, first step coverage improving layer 201 may be formed to enhance a step coverage after a CMP process has been performed for a surface of first interlayer dielectric 200.

Further, first step coverage improving layer 201 may be an oxide, for example deposited by a CVD. First step coverage improving layer 201 may function to adjust a thickness of an interlayer dielectric to prevent a step coverage from being formed in a surface of first interlayer dielectric 200.

Moreover, first step coverage improving layer 201 may be formed of at least one of hydrogen silsesquioxane (HSQ), phospho silicate glass (PSG), fluorinated silicate glass (FSG), methyl silsesquioxane (MSQ), and undoped silicate glass (USG).

In addition, first step coverage improving layer 201 may be formed of the same or different material as that of first interlayer dielectric 200. Tuning the removal rate by materials may be possible in a subsequent planarization process, for example, a CMP process.

After forming first step coverage improving layer 201, an etch back process or a CMP process may be performed. This process may planarize first step coverage improving layer 201. According to embodiments, through the etch back or CMP process, a removed amount of first step coverage improving layer 201 may be 80±10% of a thickness of first step coverage improving layer 201.

Photo and etching processes may be carried out to form a via hole. The via hole may be filled with tungsten W 100 and may form a via plug. Second metal M2 may formed and planarized.

As shown in main chip region 2, in the interlayer mutual connection formed in embodiments, an opening of the via hole may be enhanced, and a connection between metals may be improved. Tungsten may be filled in the via hole.

Figure 5:
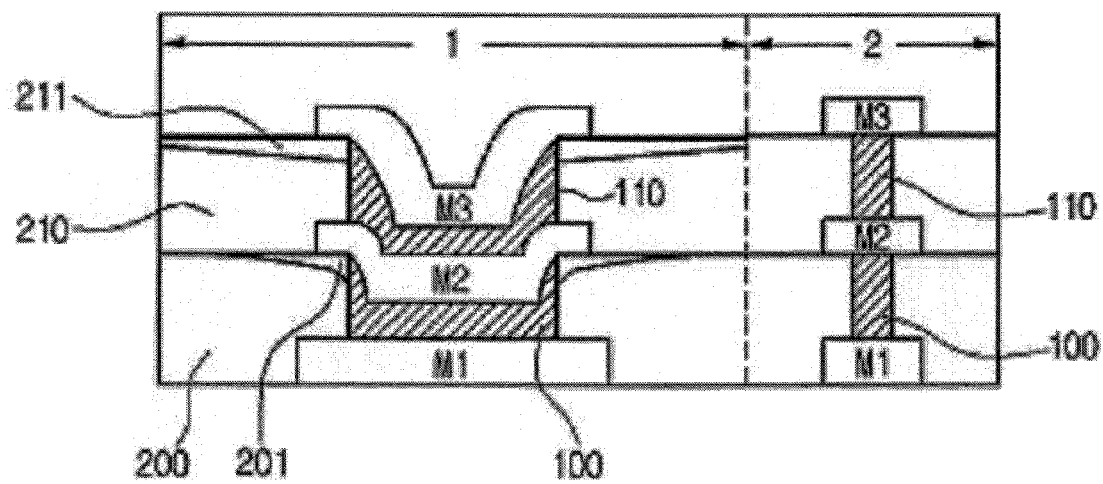

Referring to FIG. 5, after a formation of a pattern of second metal M2, an oxide may be deposited on second metal M2, for example by the CVD process, and may form second interlayer dielectric 210.

Upon the formation of second interlayer dielectric 210, the CMP process advances. According to embodiments, so as to improve a step coverage of the main chip and a scribe lane, second step coverage improving layer 211 may be formed.

Second step coverage improving layer 211 may be formed according to a similar or identical formation method of first step coverage improving layer 201. After forming second step coverage improving layer 211, an etch back process or a CMP process may be further performed therefor.

Via photolithography and etch processes may then be performed to form the via hole, and the formed via hole may then be filled with tungsten 110 and may form the via plug.

According to embodiments, during a via photolithography process being performed to form the via hole, a defocus phenomenon may be prevented. Accordingly, a mutual connection between metals M2 and M3 may be achieved by tungsten 110 filled in the via hole.

According to embodiments, a defocus phenomenon occurring during a via photolithography process may be prevented.

Figure 6:
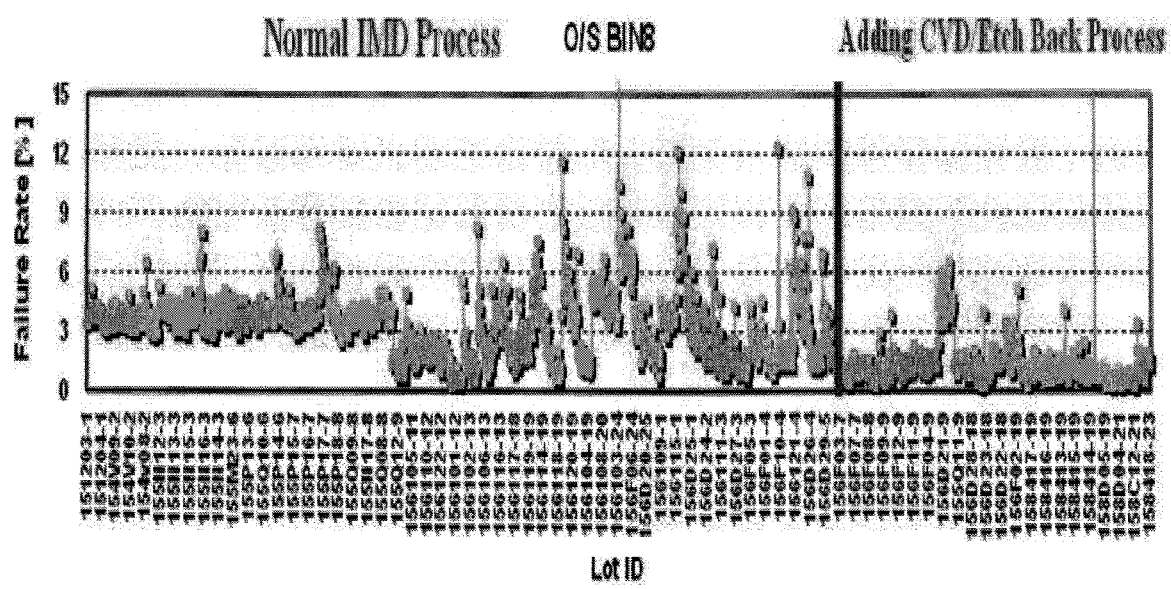
FIG. 6 is a photograph showing an improved/reduced failure rate of a via hole in a semiconductor device according to embodiments.

Referring to FIG. 6, a failure rate of the via hole when a step coverage improving layer is formed may be significantly reduced as compared to an IMD process 300 according to the related art.

Figure 7:
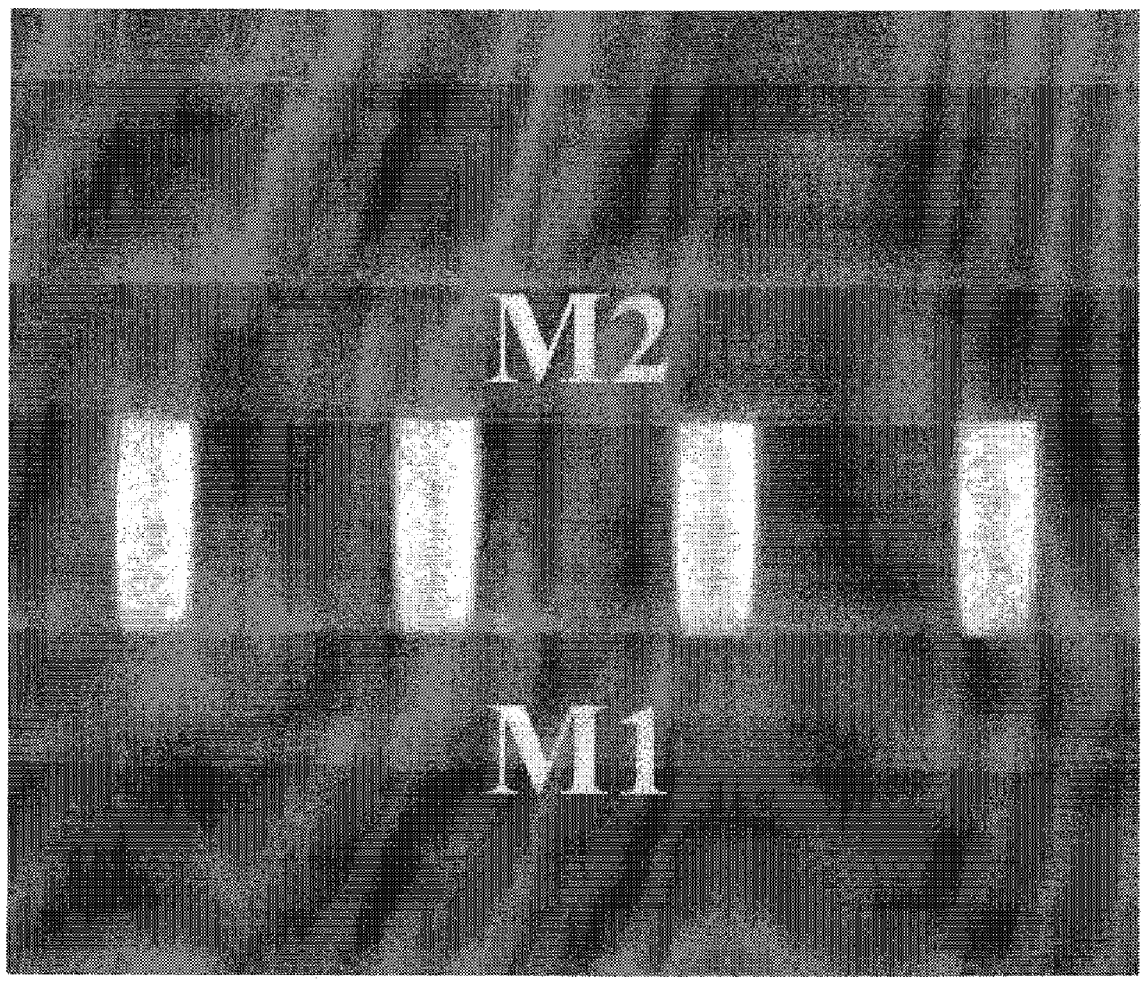
FIG. 7 is an SEM photograph showing a shape of a via hole formed by a method for manufacturing a semiconductor device according to embodiments.

Referring to FIG. 7, the SEM photograph illustrates a confirmation that, according to embodiments, a mutual connection can be more reliably achieved by the formed via hole.

According to embodiments, after a deposition of the interlayer dielectric, a step coverage of the main chip and a scribe lane region may be improved.

According to embodiments, after the deposition of the interlayer dielectric, a step coverage may be enhanced. Accordingly, a defocus phenomenon in a via hole formation process (which may be a subsequent process) may be improved. This may cause a yield of semiconductor devices to be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming metal layers over each of a main chip region and a scribe lane region of a substrate, respectively;
   forming an interlayer dielectric over the substrate including the metal layers; and
   forming a step coverage improving layer over the interlayer dielectric of only the scribe lane region to have a height substantially equal to a height of the dielectric region over the main chip region.

2. The method of claim 1, further comprising:
   planarizing the interlayer dielectric prior to forming the step coverage improving layer;
   planarizing the step coverage improving layer;
   forming a via hole in the planarized step coverage improving layer and the planarized interlayer dielectric; and
   forming the via hole with a metal to form a via plug.

3. The method of claim 2, wherein the step coverage improving layer comprises at least one of hydrogen silsesquioxane (HSQ), phospho silicate glass (PSG), fluorinated silicate glass (FSG), methyl silsesquioxane (MSQ), and undoped silicate glass (USG).

4. The method of claim 3, wherein the step coverage improving layer comprises an oxide, which is deposited by a chemical vapor deposition.

5. The method of claim 3, wherein the step coverage improving layer is planarized by an etch back process.

6. The method of claim 3, wherein the step coverage improving layer is planarized by a chemical mechanical polishing process.

7. The method of claim 3, wherein a thickness ranging from 80±10% of the step coverage improving layer is removed when the step coverage improving layer is planarized.

8. The method of claim 1, wherein a material used to form the step coverage improving layer is substantially identical to a material used to form the interlayer dielectric.

9. The method of claim 1, wherein a material used to form the step coverage improving layer is different than a material used to form the interlayer dielectric.

* * * * *